(12) United States Patent
Chang et al.

(10) Patent No.: US 11,430,691 B2
(45) Date of Patent: Aug. 30, 2022

(54) POLISHING INTERCONNECT STRUCTURES IN SEMICONDUCTOR DEVICES

(71) Applicant: Taiwan Semiconductor Manufacturing Co., Ltd., Hsin-Chu (TW)

(72) Inventors: Pang-Sheng Chang, Hsinchu (TW); Chao-Hsun Wang, Taoyuan County (TW); Kuo-Yi Chao, Hsinchu (TW); Fu-Kai Yang, Hsinchu (TW); Mei-Yun Wang, Hsin-Chu (TW); Li-Chieh Wu, Hsinchu (TW); Chun-Wei Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 27 days.

(21) Appl. No.: 16/944,876

(22) Filed: Jul. 31, 2020

(65) Prior Publication Data
US 2021/0257248 A1 Aug. 19, 2021

Related U.S. Application Data

(60) Provisional application No. 62/978,386, filed on Feb. 19, 2020.

(51) Int. Cl.
*H01L 21/768* (2006.01)
*H01L 23/522* (2006.01)
*H01L 23/532* (2006.01)

(52) U.S. Cl.
CPC .... *H01L 21/7684* (2013.01); *H01L 21/76814* (2013.01); *H01L 23/5226* (2013.01); *H01L 23/53266* (2013.01)

(58) Field of Classification Search
CPC .......... H01L 21/7684; H01L 21/76814; H01L 23/5226; H01L 23/53266; H01L 21/31053;
(Continued)

(56) References Cited

U.S. PATENT DOCUMENTS 8,563,403 B1 * 10/2013 Farooq .............. H01L 21/76898
438/459
9,224,640 B2 * 12/2015 Burke ............... H01L 21/76838
(Continued)

FOREIGN PATENT DOCUMENTS

TW 201939666 A 10/2019
TW 202008509 A 2/2020

*Primary Examiner* — Karen Kusumakar
(74) *Attorney, Agent, or Firm* — Haynes and Boone, LLP

(57) ABSTRACT

A method includes forming a first conductive feature over a semiconductor substrate, forming an ILD layer over the first conductive feature, patterning the ILD layer to form a trench, and forming a conductive layer over the patterned ILD layer to fill the trench. The method further includes polishing the conductive layer to form a via contact configured to interconnect the first conductive feature with a second conductive feature, where polishing the conductive layer exposes a top surface of the ILD layer, polishing the exposed top surface of the ILD layer, such that a top portion of the via contact protrudes from the exposed top surface of the ILD layer, and forming the second conductive feature over the via contact, such that the top portion of the via contact extends into the second conductive feature.

20 Claims, 14 Drawing Sheets

(58) Field of Classification Search
CPC ............ H01L 21/3212; H01L 23/5283; H01L 21/76885; H01L 21/76895; H01L 21/76897
See application file for complete search history.

(56) References Cited

U.S. PATENT DOCUMENTS

| | | | |
|---|---|---|---|
| 10,770,395 B2* | 9/2020 | Yang | H01L 21/76849 |
| 2014/0151893 A1* | 6/2014 | Boyanov | H01L 23/5226 257/774 |
| 2020/0144195 A1* | 5/2020 | Yang | H01L 23/5329 |

* cited by examiner

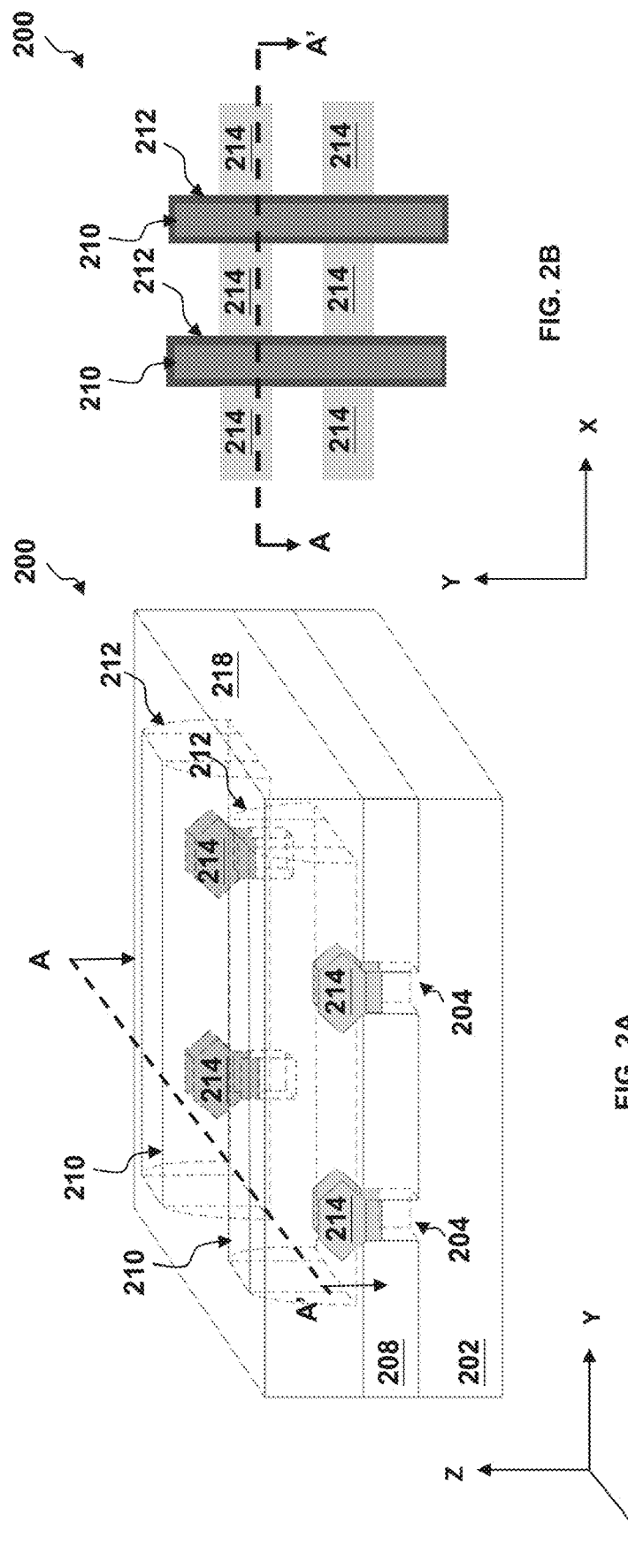

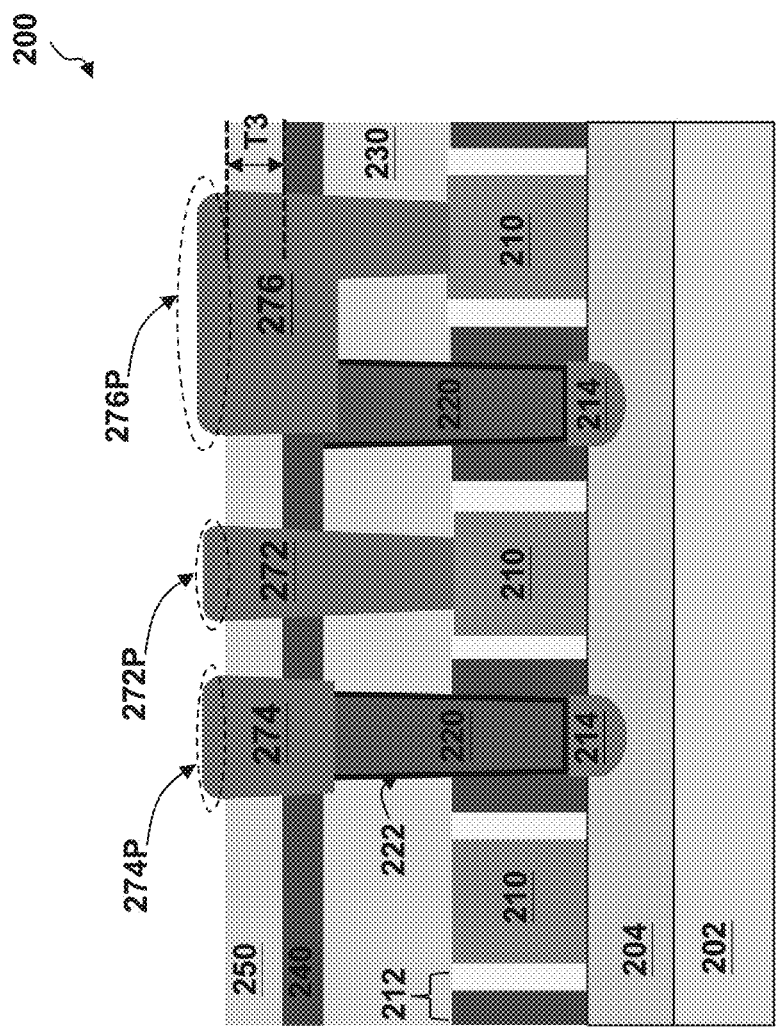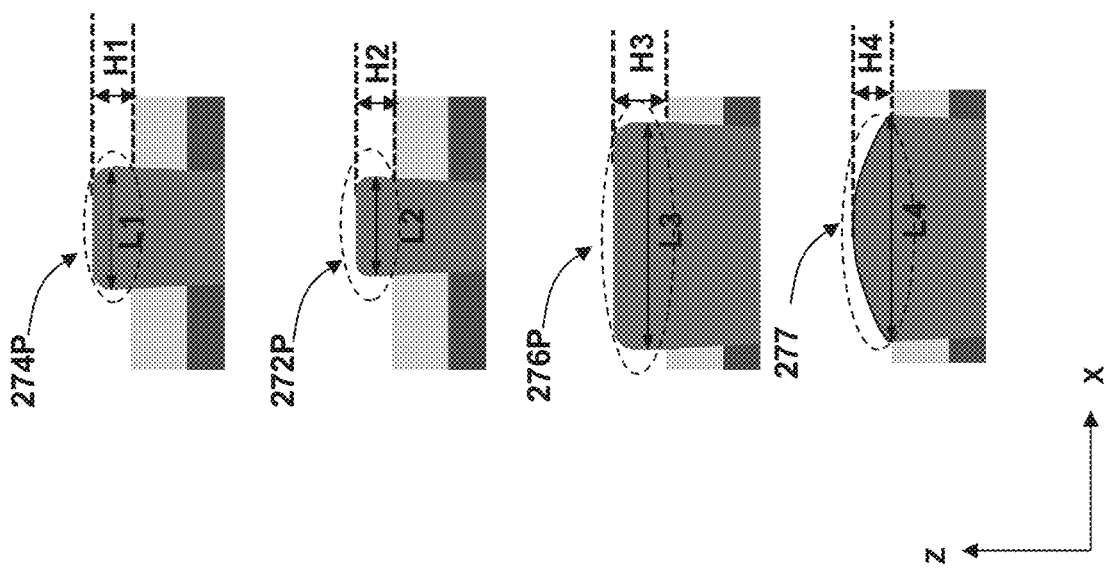
FIG. 13

POLISHING INTERCONNECT STRUCTURES IN SEMICONDUCTOR DEVICES

CROSS-REFERENCE TO RELATED APPLICATIONS

This is a non-provisional application of and claims priority to U.S. Provisional Patent Application Ser. No. 62/978,386, filed Feb. 19, 2020, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication of interconnect features becomes more challenging as feature sizes continue to decrease. Though existing methods of fabricating butted contacts and interconnect features including, for example, performing chemical-mechanical polishing (CMP) processes to planarize metal layers, have been generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a perspective three-dimensional view of an embodiment of a semiconductor device according to various aspects of the present disclosure.

FIG. 2B is a planar top view of an embodiment of a semiconductor device according to various aspects of the present disclosure.

FIGS. 3, 4, 5, 6, 7, 8, 9, 10, 11, 12, 13, 14, 15, and 16 are cross-sectional views of an embodiment of the semiconductor device of FIG. 2A and/or FIG. 2B along line AA' during intermediate steps of an embodiment of the method of FIGS. 1A and 1B according to various aspects of the present disclosure.

DETAILED DESCRIPTION

Figure 1A:
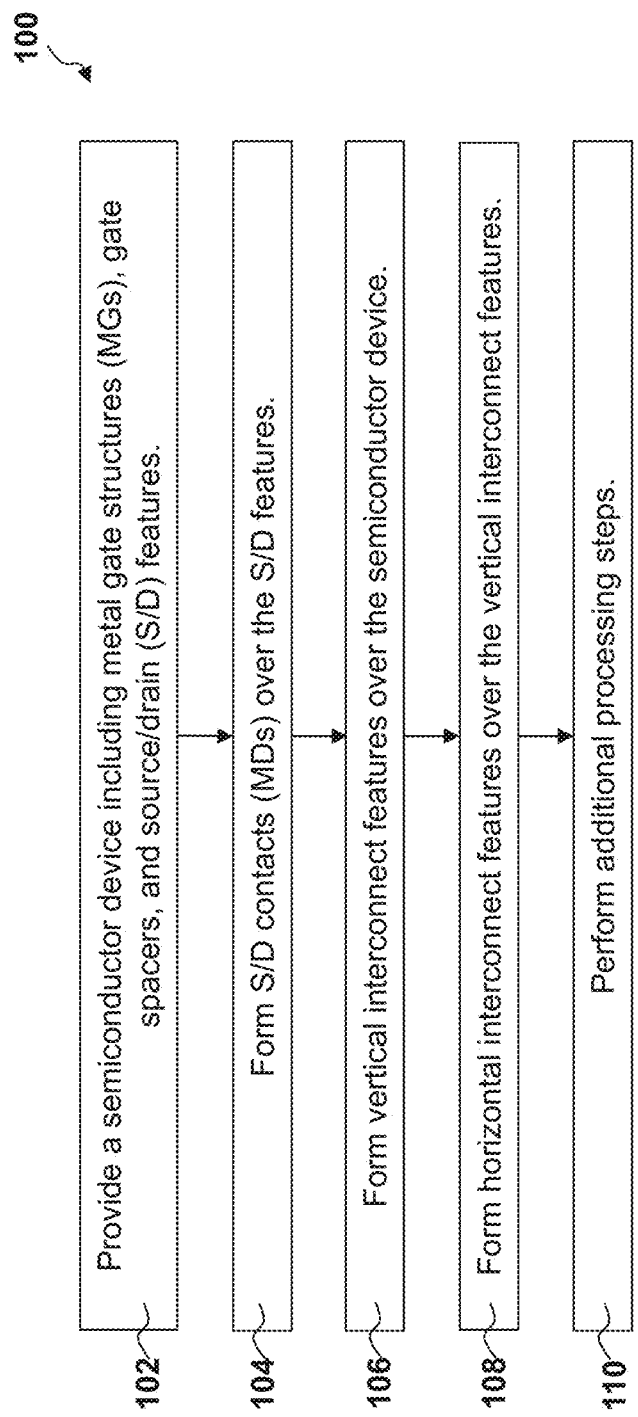
FIG. 1A shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as planar FETs, three-dimensional fin-like FETs (FinFETs), gate-all-around (GAA) FETs, or combinations thereof. It is an objective of the present disclosure to provide vertical interconnect features (e.g., vias, conductive lines, etc.).

In FET fabrication, forming interconnect features (e.g., vertical interconnect features, horizontal interconnect features, butted contacts, etc.) generally includes a series of patterning, etching, deposition, and planarization processes. In one such example, forming an interconnect feature may include first forming a trench in a dielectric layer (e.g., an interlayer dielectric, or ILD, layer) to expose a portion of an underlying conductive feature (e.g., a device-level feature, such as a gate stack or a source/drain feature, or another interconnect feature) by patterning and etching processes, forming a metal layer in the trench and over the dielectric layer by a suitable deposition process, and subsequently planarizing the metal layer to form the interconnect feature by, for example, one or more chemical mechanical polishing (CMP) processes. While general methods of planarizing the metal layer are adequate, they have not been entirely satisfactory in all aspects. For example, as feature sizes continue to decrease, general CMP processes may cause a dishing profile in the interconnect feature, causing a void to form at an interface between the interconnect feature and another conductive feature (e.g., an interconnect feature) formed thereover.

Figure 1B:
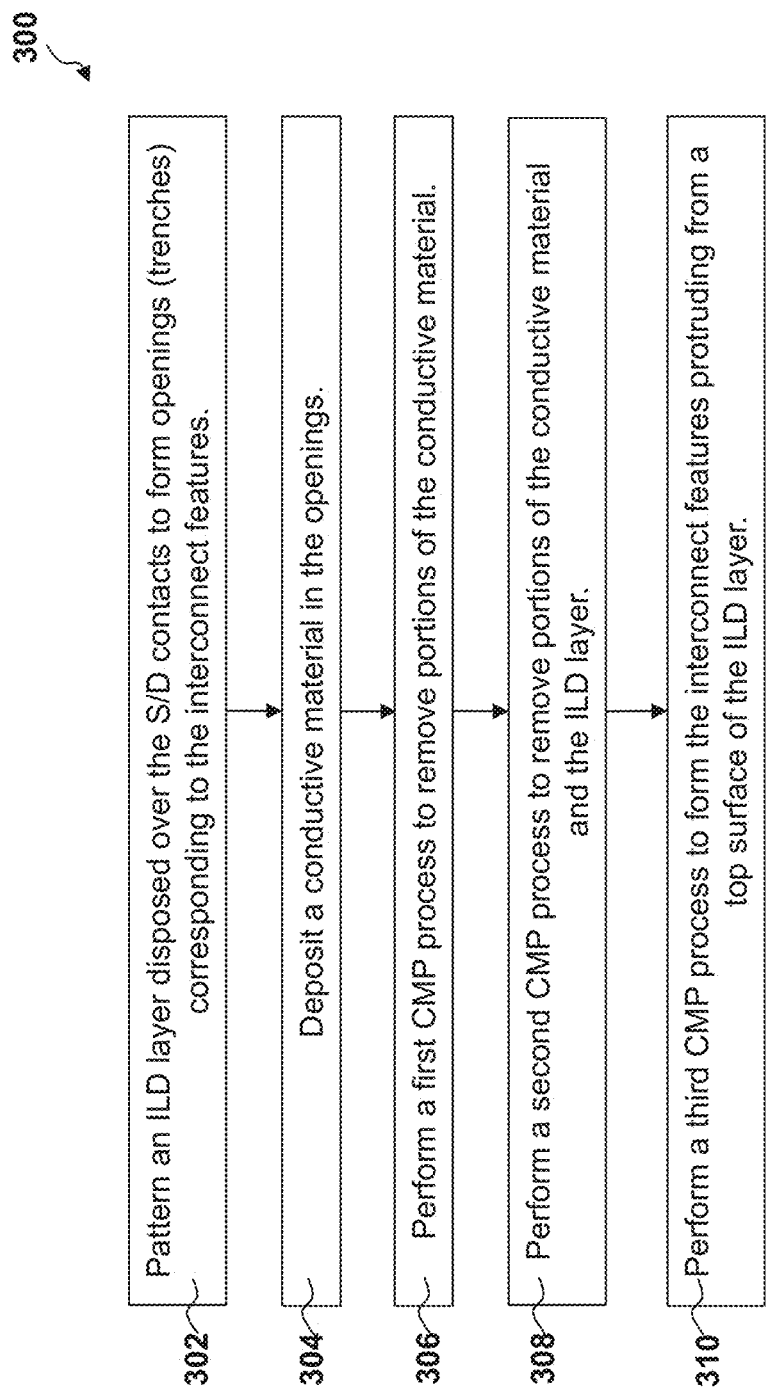
FIG. 1B shows a flow chart of a method of fabricating a semiconductor device according to various aspects of the present disclosure.

Referring now to FIGS. 1A and 1B, flowcharts of a method 100 and a method 300 of forming a semiconductor device 200 (hereafter simply referred to as the device 200) are illustrated according to various aspects of the present disclosure. The methods 100 and 300 are merely examples and are not intended to limit the present disclosure beyond what is explicitly recited in the claims. Additional operations can be provided before, during, and after the methods 100 and 300, and some operations described can be replaced, eliminated, or moved around for additional embodiments of the method. The methods 100 and 300 are described below in conjunction with FIGS. 3-16, which are cross-sectional views of the device 200 taken along the dashed line AA' shown in FIGS. 2A and 2B at intermediate steps of the methods 100 and/or 300.

The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, GAA FETs, metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 3:
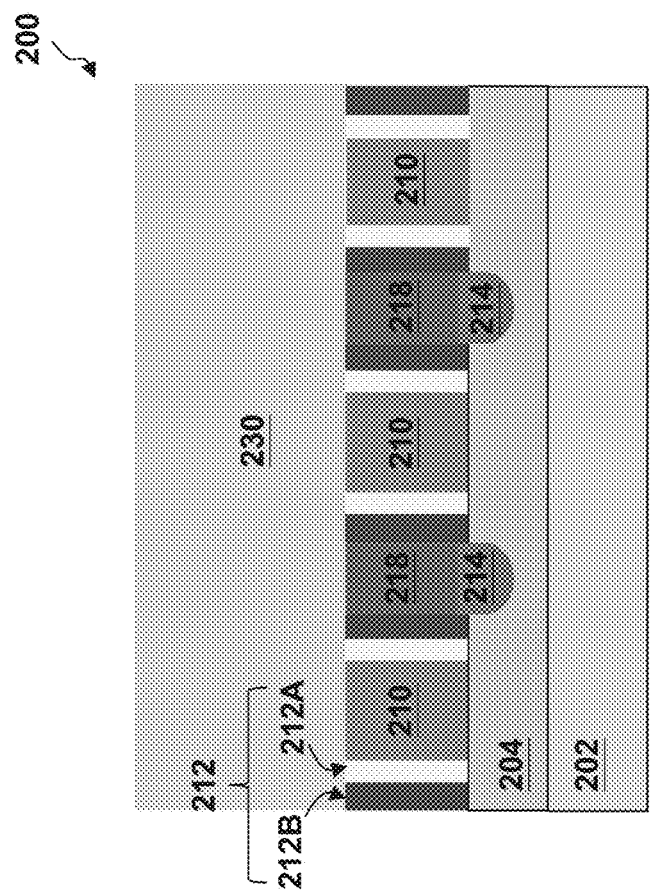

At operation 102, referring to FIGS. 2A, 2B, and 3, the method 100 provides a device 200 including a substrate 202 having a three-dimensional active region 204 (hereafter referred to as fin 204) disposed thereover. The device 200 further includes a high-k metal gate (HKMG) structure 210 disposed over the fin 204, gate spacers 212 disposed on sidewalls of the HKMG structure 210, source/drain (S/D) features 214 disposed over the fin 204, isolation structures 208 disposed over the substrate 202 separating various components of the device 200, an interlayer dielectric (ILD) layer 218 disposed over the S/D features 214, and an ILD layer 230 disposed over the ILD layer 218. As depicted in FIGS. 2A and 2B, two fins 204 are present in the device 200. For purposes of clarity, however, methods of the present embodiments will be discussed with reference to one of the two fins 204; of course, the present embodiments may be equally applicable to the other one of the two fins 204.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions are formed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, other suitable techniques, or combinations thereof.

Still referring to FIGS. 2A, 2B, and 3, the fins 204 may be suitable for forming a p-type or an n-type FinFET. The fin 204 may be fabricated using suitable processes including photolithography and etching processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), other suitable processes, or combinations thereof.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization/polishing (CMP) process. Other isolation structures such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A, 2B, and 3, the device 200 includes S/D features 214 disposed over the fins 204 and adjacent to the HKMG structure 210. The S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution and/or other suitable solutions. Subsequently, one or more epitaxial growth processes are performed to grow epitaxial features in the recesses. Each of the S/D features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe) doped with a p-type dopant such as boron, germanium, indium, and/or other p-type dopants. The n-type epitaxial material may include one or more epitaxial layers of silicon (epi Si) or silicon carbon (epi SiC) doped with an n-type dopant such as arsenic, phosphorus, and/or other n-type dopant.

The device 200 further includes the HKMG structures 210 disposed over portions of the fins 204, such that they are interposed between the S/D features 214. Each HKMG structure 210 includes a high-k dielectric layer (i.e., having a dielectric constant greater than that of silicon oxide; not depicted) disposed over the fins 204 and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Example work function materials include TiN, TaN, $ZrSi_2$, $MoSi_2$, $TaSi_2$, $NiSi_2$, Ti, Ag, TaAl, TaAlC, TiAlN, TaC, TaCN, TaSiN, Ru, Mo, Al, WN, Mn, Zr, other suitable work function materials, or combinations thereof. The bulk conductive layer may include Cu, W, Ru, Al, Co, other suitable materials, or combinations thereof. The HKMG structure 210 may further include other layers (not depicted), such as an interfacial layer disposed between the fins 204 and the high-k dielectric layer, hard mask layers, capping layers, barrier layers, seed layers, other suitable layers, or combinations thereof. Various layers of the HKMG structures 210 may be deposited by any suitable method, such as chemical oxidation, thermal oxidation, atomic layer deposition (ALD), CVD, physical vapor deposition (PVD), plating, other suitable methods, or combinations thereof. A polishing process, such as CMP, may be performed to planarize a top surface of the device 200.

The device 200 further includes gate spacers 212 disposed on sidewalls of each HKMG structure 210. The gate spacers 212 may be a single-layer structure or a multi-layer structure. In some examples, as depicted herein, the gate spacers 212 are multi-layer structures having a first layer 212A disposed on the sidewalls of the HKMG structure 210 and a second layer 212B disposed on the first layer 212A. Of course, other configurations (e.g., only one spacer layer, more than two spacer layers, etc.) may also be applicable to the present embodiments. The gate spacers 212 may include aluminum oxide, aluminum oxynitride, hafnium oxide, titanium oxide, zirconium aluminum oxide, zinc oxide, tantalum oxide, lanthanum oxide, yttrium oxide, silicon oxycarbonitride, tantalum carbonitride, silicon nitride, zirconium nitride, silicon carbonitride, silicon oxide, silicon oxycarbide, hafnium silicide, silicon, zirconium silicide, other suitable materials, or combinations thereof. Notably, the composition of the gate spacers 212 is distinct from that of the surrounding dielectric components, such that an etching selectivity exists between the gate spacers 212 and the surrounding dielectric components during subsequent etching processes. Each layer of the gate spacers 212 may be formed by first depositing a blanket of spacer material over the device 200, and then performing an anisotropic etching process to remove portions of the spacer material to form the layer of the gate spacers 212 over the sidewalls of the HKMG structure 210.

In some embodiments, the HKMG structures 210 are formed after other components of the device 200 (e.g., the S/D features 214) are fabricated. Such process is generally referred to as a gate replacement process, which includes forming a dummy gate structure (not depicted) as a placeholder for each HKMG structure 210, forming the S/D features 214 adjacent to the dummy gate structure, forming the ILD layer 218 (and optionally an etch-stop layer, or ESL) over the dummy gate structure and the S/D features 214, planarizing the ILD layer 218 by, for example, CMP, to expose a top surface of the dummy gate structure, removing the dummy gate structure in the ILD layer 218 to form a gate trench (not depicted) that exposes a channel region of the fins 204, and forming the HKMG structure 210 in the gate trench to complete the gate replacement process. In some embodiments, the ILD layer 218 includes a dielectric material, such as a low-k dielectric material, tetraethylorthosilicate (TEOS), silicon oxide, doped silicon oxide such as borophosphosilicate glass (BPSG), fluoride-doped silicate glass (FSG), phosphosilicate glass (PSG), boron doped silicon glass (BSG), other suitable dielectric materials, or combinations thereof. The ILD layer 218 may include a multi-layer structure having multiple dielectric materials and may be formed by a deposition process such as, for example, CVD, FCVD, SOG, other suitable methods, or combinations thereof. If included, the ESL may comprise silicon nitride, silicon oxynitride, silicon nitride with oxygen or carbon elements, other suitable materials, or combinations thereof, and may be formed by CVD, PVD, ALD, other suitable methods, or combinations thereof. Thereafter, the ILD layer 230, which may be substantially similar to the ILD layer 218, is formed over the device 200 by any suitable method discussed above with respect to the ILD layer 218. In some embodiments, though not depicted, an ESL is deposited over the ILD layer 218 before forming the ILD layer 230 thereover.

Figure 4:
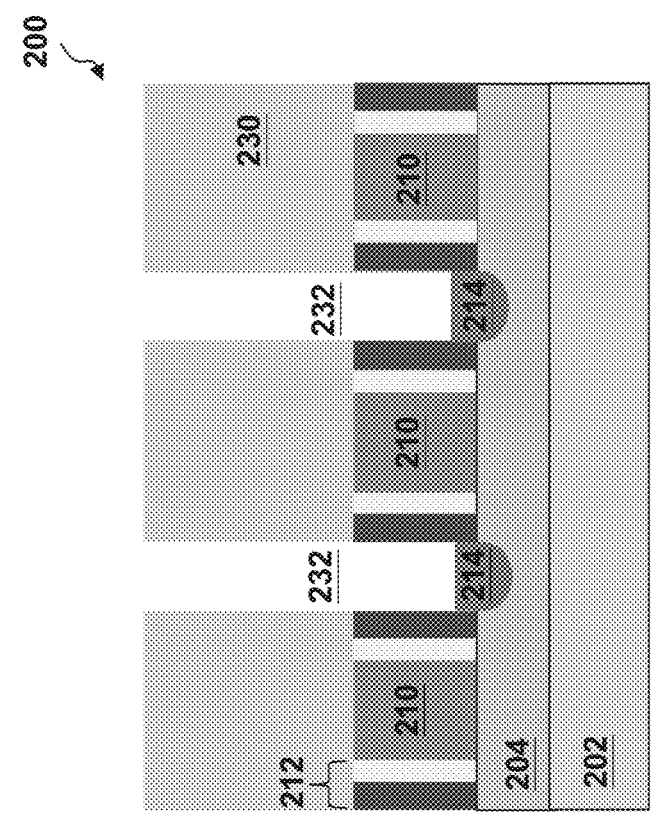
Figure 5:
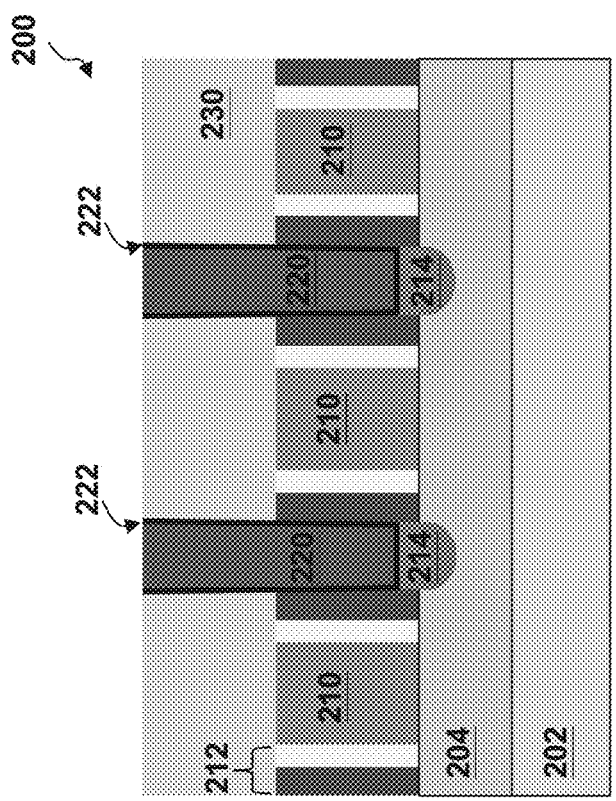

Referring to FIGS. 4 and 5, the method 100 at operation 104 forms S/D contacts 220 over the S/D features 214. Referring to FIG. 4, the method 100 removes portions of the ILD layers 218 and 230 disposed over the S/D features 214 to form trenches 232. The method 100 may implement a series of patterning and etching processes to form the trenches 232. For example, the method 100 may first form a masking element (not depicted) over the ILD layer 230, expose the masking element to a radiation source through a patterned photomask, develop the exposed masking element to form a patterned masking element that includes trenches exposing portions of the ILD layer 230, and etching the ILD layers 230 and 218 using the patterned masking element as an etch mask to form the trenches 232. In some embodiments, the etching process is a dry etching process that employs one or more plasma, such as $C_4F_6$, oxygen, hydrogen, other suitable gases, or combinations thereof.

Referring to FIG. 5, the method 100 then deposits a conductive material in the trenches 232 to form the S/D contacts 220. The conductive material may include Co, W, Ru, Cu, Ta, Ti, Al, Mo, other suitable materials, or combinations thereof. The conductive material may be deposited by any suitable method, such as CVD, PVD, ALD, plating, other suitable methods, or combinations thereof. In some embodiments, a silicide layer (not depicted) is formed between the S/D features 214 and the S/D contacts 220. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. For example, a metal layer (e.g., titanium) may be deposited over the S/D features 214, and the device 200 is annealed to allow the metal layer and the semiconductor materials of the S/D features 214 to react. Thereafter, the un-reacted metal layer is removed, leaving the silicide layer over the S/D features 214. In some embodiments, as depicted herein, a barrier layer (or glue layer) 222 is formed in the trenches 232 by a suitable deposition process, such as ALD, before forming the S/D contacts 220. The barrier layer 222 may include Ti, TiN, Ta, TaN, other suitable materials, or combinations thereof. Thereafter, still referring to FIG. 5, the method 100 planarizes the conductive material using a suitable method such as a CMP process to form the S/D contacts 220 over the S/D features 214. In the depicted embodiments, the method 100 at operation 104 implements one or more CMP processes to remove at least the portions of the conductive material formed over a top surface of the ILD layer 230.

Subsequently, the method 100 at operation 106 forms various vertical interconnect features over the device 200. As depicted herein, referring to FIGS. 1B and 6 to 13, operation 106 may be implemented by performing intermediate steps of the method 300 to the device 200. In the present embodiments, referring to FIG. 13, vertical interconnect features 272 and 274 are configured to interconnect one of the HKMG structures 210 and one of the S/D contacts 220, respectively, with subsequently-formed horizontal interconnect features (hereafter referred to as conductive lines), and are hereafter referred to as via contacts 272 and 274. In addition, vertical interconnect feature 276 is configured to internally couple one of the S/D contacts 220 with an adjacent HKMG structure 210 to form a butted contact and is hereafter referred to as the BCT 276. It is understood that the present embodiments do not require the presence of all of the via contact 272, via contact 274, and BCT 276, and furthermore, the present embodiments do not require that the via contact 272, via contact 274, and BCT 276 are formed on a single fin 204.

Figure 6:
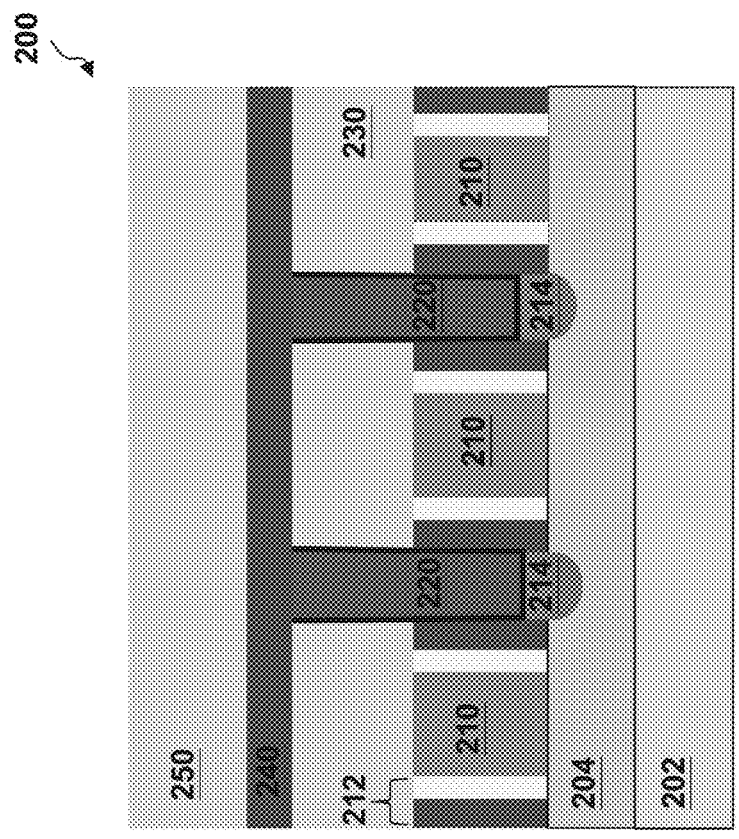

Now referring to FIGS. 6 to 9, the method 300 at operation 302 forms an ILD layer 250 over the ILD layer 230 and subsequently patterns the ILD layer 250. Referring to FIG. 6, the method 300 may first form an ESL 240 over the device 200 and then form the ILD layer 250 over the ESL 240. In the present embodiments, the ESL 240 includes silicon nitride, silicon oxynitride, silicon nitride with oxygen or carbon elements, other suitable materials, or combinations thereof, and may be formed by CVD, PVD, ALD, other suitable methods, or combinations thereof. The ILD layer 250 may be similar to or substantially the same as the ILD 218 and may be formed in a process similar to that of the ILD layer 218 as discussed above. In some examples, the ESL 240 may be optional.

Figure 8:
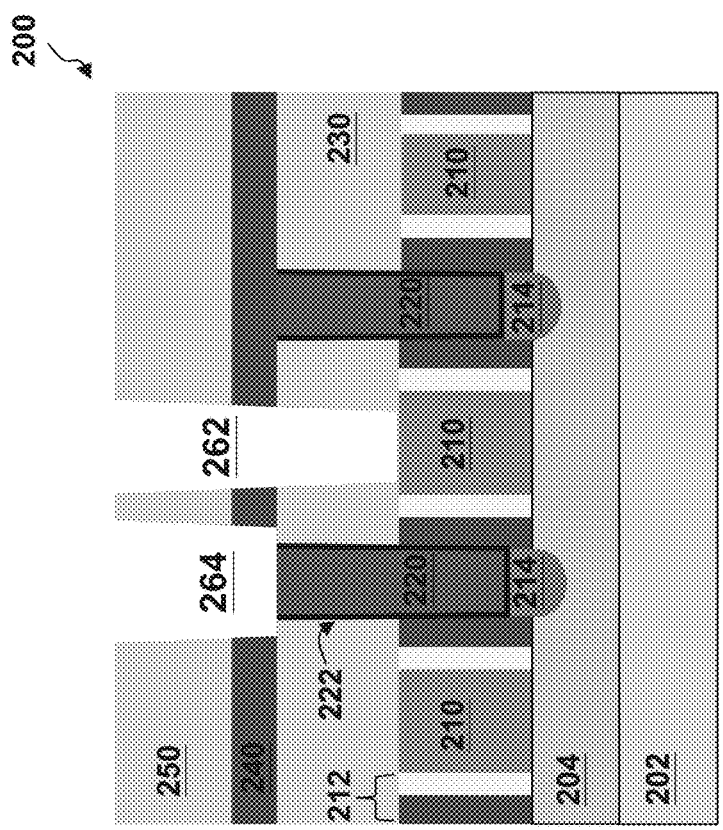
Figure 7:
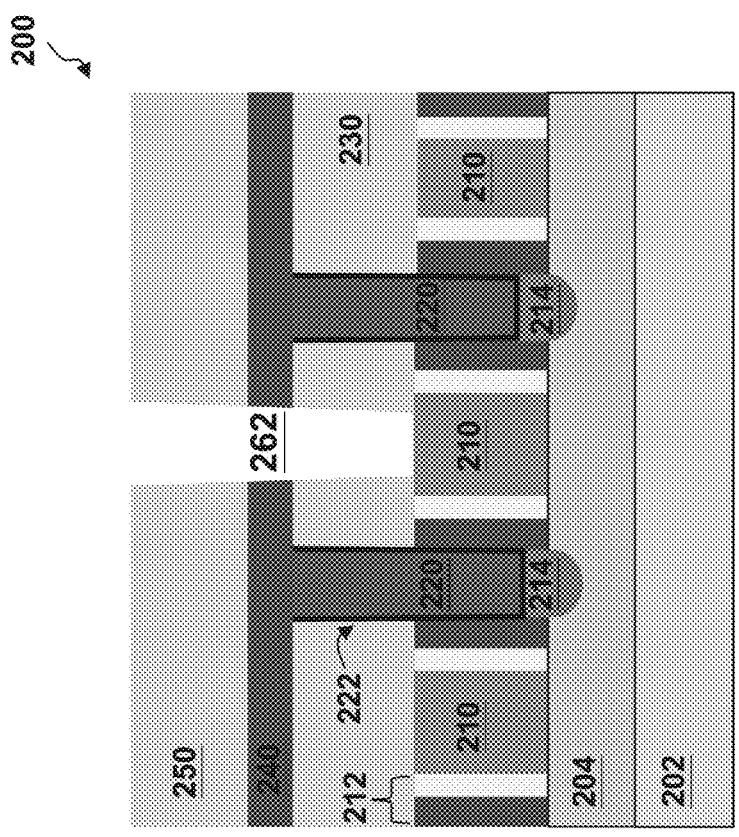
Figure 9:
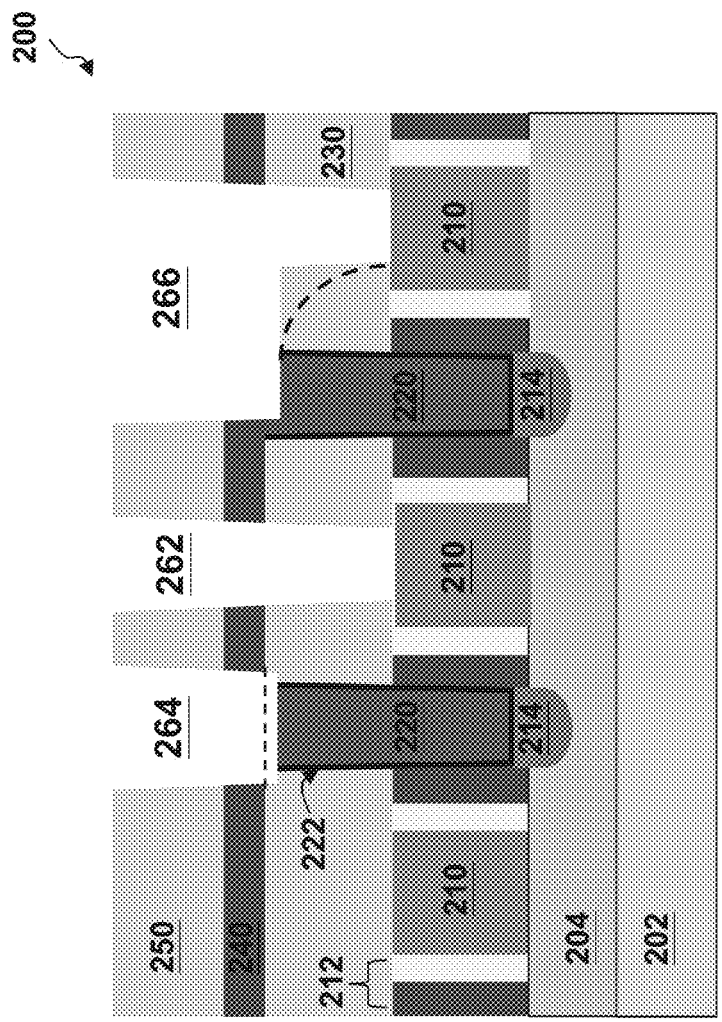

Thereafter, referring to FIGS. 7 to 9, the method 300 at operation 302 patterns the ILD layer 250 (and the ESL 240 if included) to form trenches 262, 264, and 266 configured for the via contact 272, via contact 274, and BCT 276, respectively. Referring to FIGS. 7 and 8, the method 300 forms the trenches 262 and 264 to expose one of the HKMG structures 210 and one of the S/D contacts 220, respectively. The trenches 262 and 264 may each be formed in a series of patterning and etching processes similar to that discussed above with respect to forming the trenches 232. For example, the method 300 may first form a masking element (not depicted) over the ILD layer 250, expose the masking element to a radiation source through a patterned photomask, develop the exposed masking element to form a patterned masking element that includes trenches exposing portions of the ILD layer 250, and etching the ILD layers 250 and 230 using the patterned masking element as an etch mask to form the trench 262 (and/or the trench 264). In some embodiments, the trench 264 extends to below a top surface of the S/D contact 220 as denoted by the horizontal dotted line. Similarly, referring to FIG. 9, the method 300 forms the trench 266 to expose another S/D contact 220 and a neighboring HKMG structure 210 via a series of patterning and etching processes as discussed above. In some embodiments, a bottom portion of the trench 266 extends downward to include a curved surface as denoted by the curved dotted line. Notably, the order by which the trenches 262-266 are formed is not limited to that depicted herein. For example, the present embodiments also provide that the trenches 262-266 may be formed by applying a single patterned masking element and concurrently performing etching processes to expose portions of the device 200.

Subsequently, referring to FIG. 10, the method 300 at operation 304 deposits a conductive layer 270 over the device 200, thereby filling the trenches 262-266 to above a top surface of the ILD layer 250. The conductive layer 270 may include W, Ru, Cu, Ta, Ti, Al, Mo, other suitable materials, or combinations thereof, and may be deposited by any suitable method, such as CVD, PVD, ALD, plating, other suitable methods, or combinations thereof. In the present embodiments, the conductive layer 270 includes W and/or other metals that may be oxidized by one or more acid discussed in detail below. In some embodiments, a barrier layer (or glue layer; not depicted) is formed in the trenches 262-266 by a suitable deposition process, such as ALD, before forming the conductive layer 270. The barrier layer may include Ti, TiN, Ta, TaN, other suitable materials, or combinations thereof. In some embodiments, a portion of the conductive layer 270 extends to below the top surface of the S/D contact 220. Additionally, in some embodiments, as discussed above with respect to FIG. 9, a bottom portion of the conductive layer 270 connecting the S/D contact 220 to the HKMG structure 210 is configured to have a curved surface denoted by the dotted line.

Figure 10:
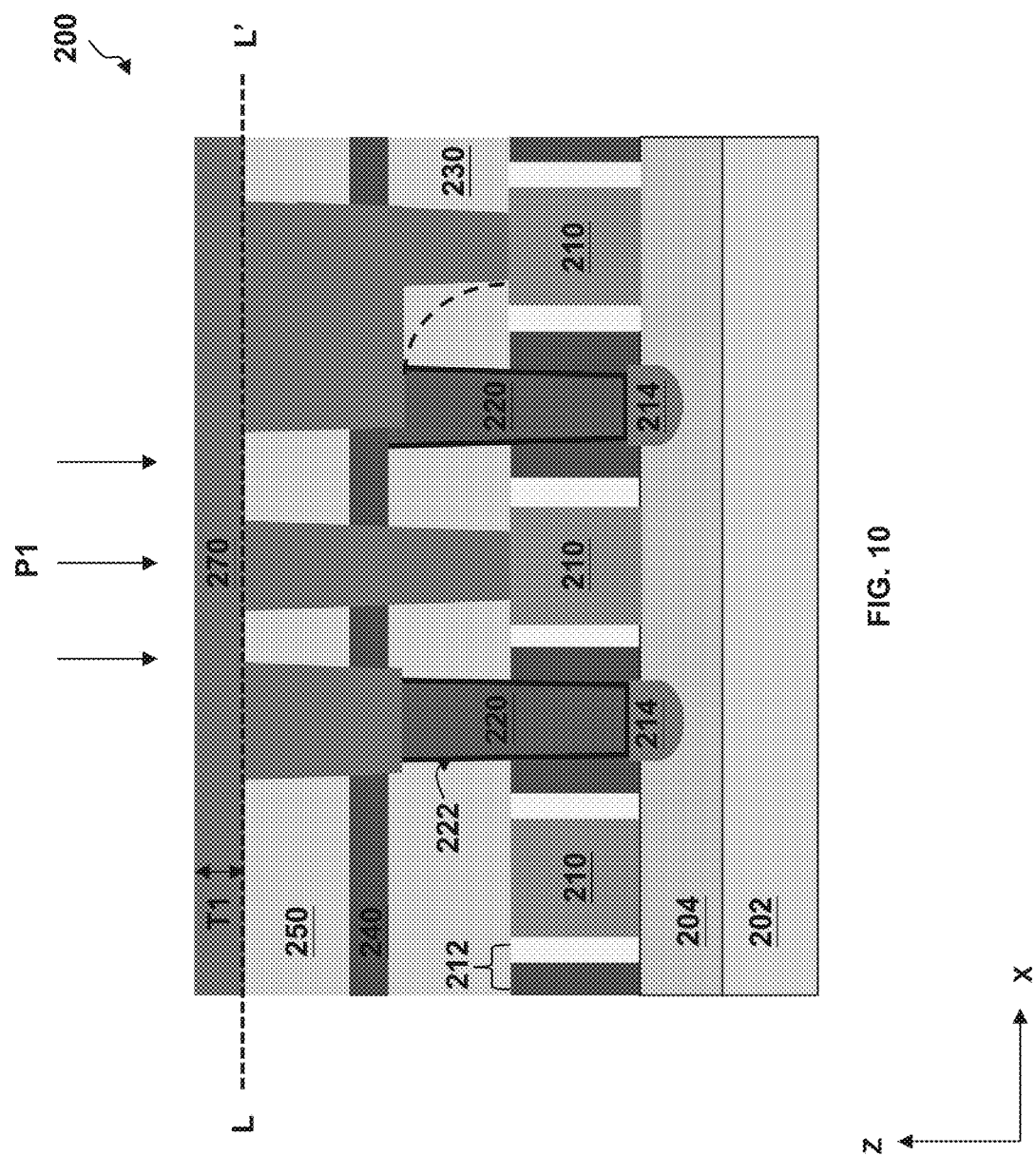
Figure 11:
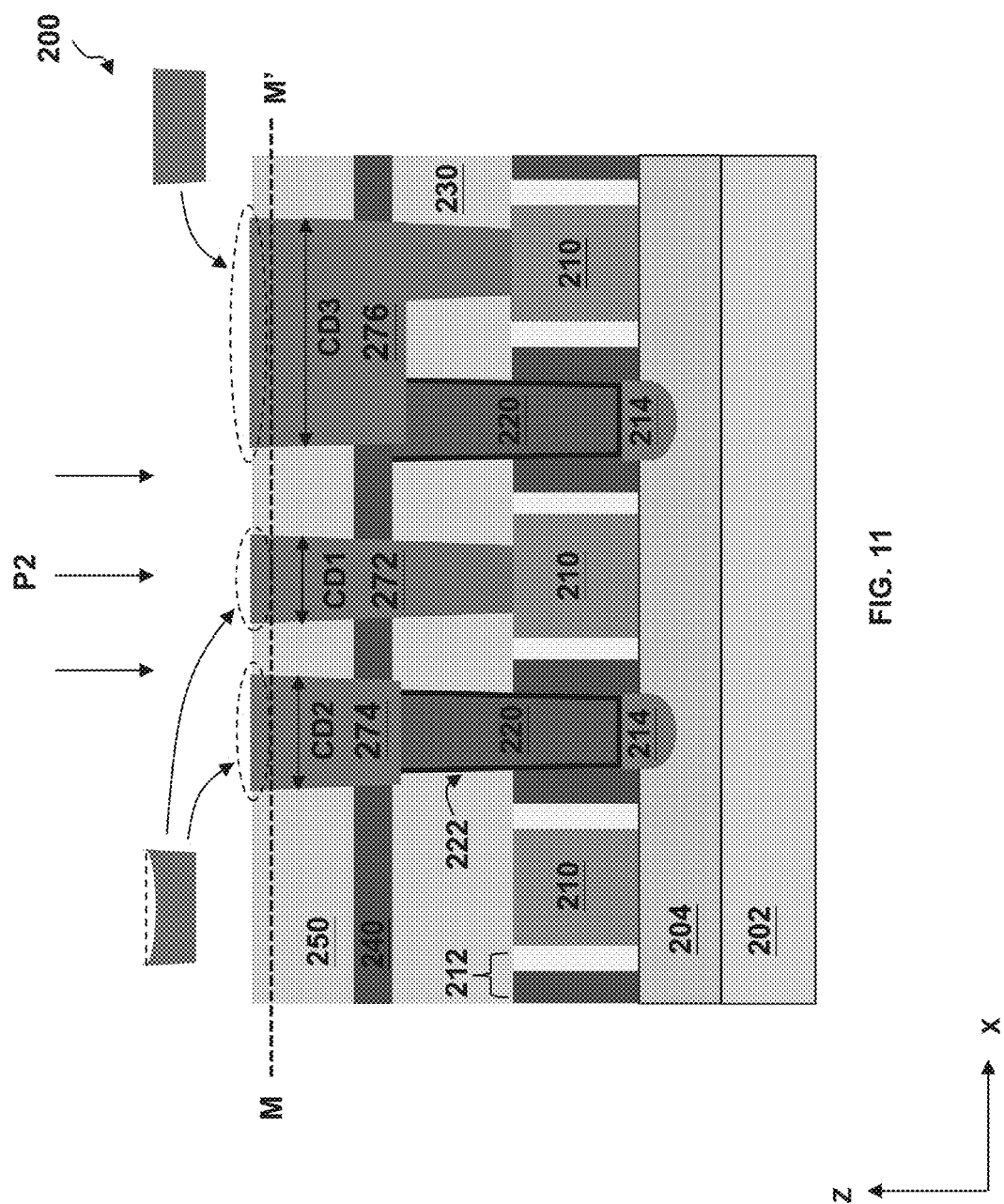

Still referring to FIG. 10 and further to FIG. 11, the method 300 at operation 306 performs a CMP process P1 to planarize a top surface of the device 200, thereby forming the via contact 272, via contact 274, and BCT 276. In the depicted embodiments, the CMP process P1 is implemented along dotted line LL', i.e., along the top surface of the ILD layer 250, to substantially remove portions of the conductive layer 270 formed over the ILD layer 250. In the present embodiments, an amount of the conductive layer 270 removed at operation 306 varies based on a thickness T1 of the portion of the conductive layer 270 formed over the ILD layer 250. In some embodiments, the CMP process P1 is implemented continuously until the top surface of the ILD layer 250 is exposed. Stated differently, the CMP process P1 is configured to substantially polish away the conductive layer 270 without removing, or substantially removing, portions of the ILD layer 250.

In the present embodiments, the selective polishing of different components of the device 200 is accomplished by factors including at least the duration of the CMP process and/or the composition of a CMP slurry employed during the CMP process. A CMP slurry generally includes at least an oxidizer (e.g., $H_2O_2$, $KIO_4$, $NaIO_4$, $NaClO$, $KIO_3$, $KClO_4$, other suitable oxidizers, or combinations thereof) and a plurality of abrasive particles including, for example, silicon oxide, cerium oxide, aluminum oxide, other suitable abrasive particles or combinations thereof. In the present embodiments, the CMP slurry may additionally include an amine (e.g., benzotriazole and derivatives thereof, other amines, or combinations thereof), a pH buffering agent (e.g., KOH) to maintain a suitable pH in the CMP slurry and/or other agents such as an organic acid (e.g., citric acid, oxalic acid, other suitable acids, or combinations thereof), a polymer (e.g., polyethylene glycol and derivatives thereof, other polymers, or combinations thereof), an organic phosphoric acid having an alkyl group that includes 1-12 carbon atoms, other suitable chemical agents, or combinations thereof.

Furthermore, one or more metal-based agent may be used as a catalyst for the oxidation of the metals in the conductive layer 270. In some embodiments, polymers such as polyethylene glycol may be configured to suppress the removal rate of an oxide material (e.g., the ILD layer 250).

In the present embodiments, in the presence of the polishing motion provided by the abrasive particles, the oxidizer, such as $H_2O_2$, in combination with one or more of the additional chemical agents is configured to enhance the removal rate of metals (e.g., the conductive layer 270), while amines may be provided as inhibitors for suppressing the removal rate of metals. In the present embodiments, the polishing selectivity of the CMP process may be adjusted by adjusting the ratio of the amount of oxidizer to the amount of inhibitor. For purposes of comparison as discussed in detail below, a ratio of the amount of the oxidizer to the amount of inhibitor included in the slurry implemented for the CMP process P1 may be defined as X1.

With respect to operation 306, due to the presence of a chemically distinguishable interface between the conductive layer 270 and the ILD layer 250, the CMP process P1 may be stopped by the detection of the ILD layer 250, which substantially includes an oxide-containing material as discussed above, and by the use of a CMP slurry configured to enhance the removal rate of the conductive layer 270 while suppressing the removal rate of the ILD layer 250. In other words, the CMP slurry implemented at the CMP process P1 promotes the oxidation of the conductive layer 270. In some embodiments, the polishing selectivity, defined as a ratio of the removal rate of the ILD layer 250 to the removal rate of the conductive layer 270, is about 1:30 to about 1:50 for the CMP process P1.

For embodiments of the CMP process P1 in which the conductive layer 270 includes W, iron (III) nitrate $(Fe(NO_3)_3)$ may be used as a catalyst for the oxidation of W by the oxidizer $H_2O_2$ in an example reaction as follows:

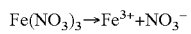
$Fe(NO_3)_3 \rightarrow Fe^{3+} + NO_3^-$

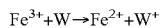
$Fe^{3+} + W \rightarrow Fe^{2+} + W^+$

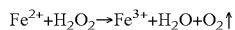
$Fe^{2+} + H_2O_2 \rightarrow Fe^{3+} + H_2O + O_2\uparrow$

The resuling tungsten ions $W^+$ remains in a top poriton of the conductive layer 270 and forms a tungsten oxide ($WO_x$), which is subsequently removed by the polishing motion of the abrasive particles. In some examples, additional chemical agents may be included to augment various aspects of the CMP process P1. For example, organic acids may be included to enhance the removal rate of the conductive layer 270, and polyethylene glycol may be included to suppress removal rate of the ILD layer 250. In some embodiments, the slurry utilized for the CMP process P1 has a pH value of about 2 to less than about 7. In some embodiments, the slurry utilized for the CMP process P1 is free or substantially free of any basic agents, such as amines.

In some embodiments, referring to FIG. 11, the top surfaces of at least the via contacts 272 and 274 are slightly recessed, i.e., having a dishing or concave profile, after performing the CMP process P1. The top surface of the BCT 276, in some instances, may be substantially more leveled with the ILD layer 250 or less recessed than those of the via contacts 272 and 274. This may be a result of the relative critical dimension (e.g., width) of the via contacts depicted herein. At a given removal rate, the amount of material polished away is generally averaged over an area subjected to the polishing process. As such, a feature having a greater critical dimension provides a larger polishing area, which generally correlates to a less extent of polishing in comparison to a feature having a smaller critical dimension. In the depicted embodiments, for example, the via contacts 272 and 274 may be defined by critical dimensions CD1 and CD2, respectively, which are both less than the critical dimension CD3 of the BCT 276. As a result, the extent of recessing in the via contacts 272 and 274 is greater than that in the BCT 276, leading to more pronounced dishing profiles presented at their top surfaces.

Figure 12:
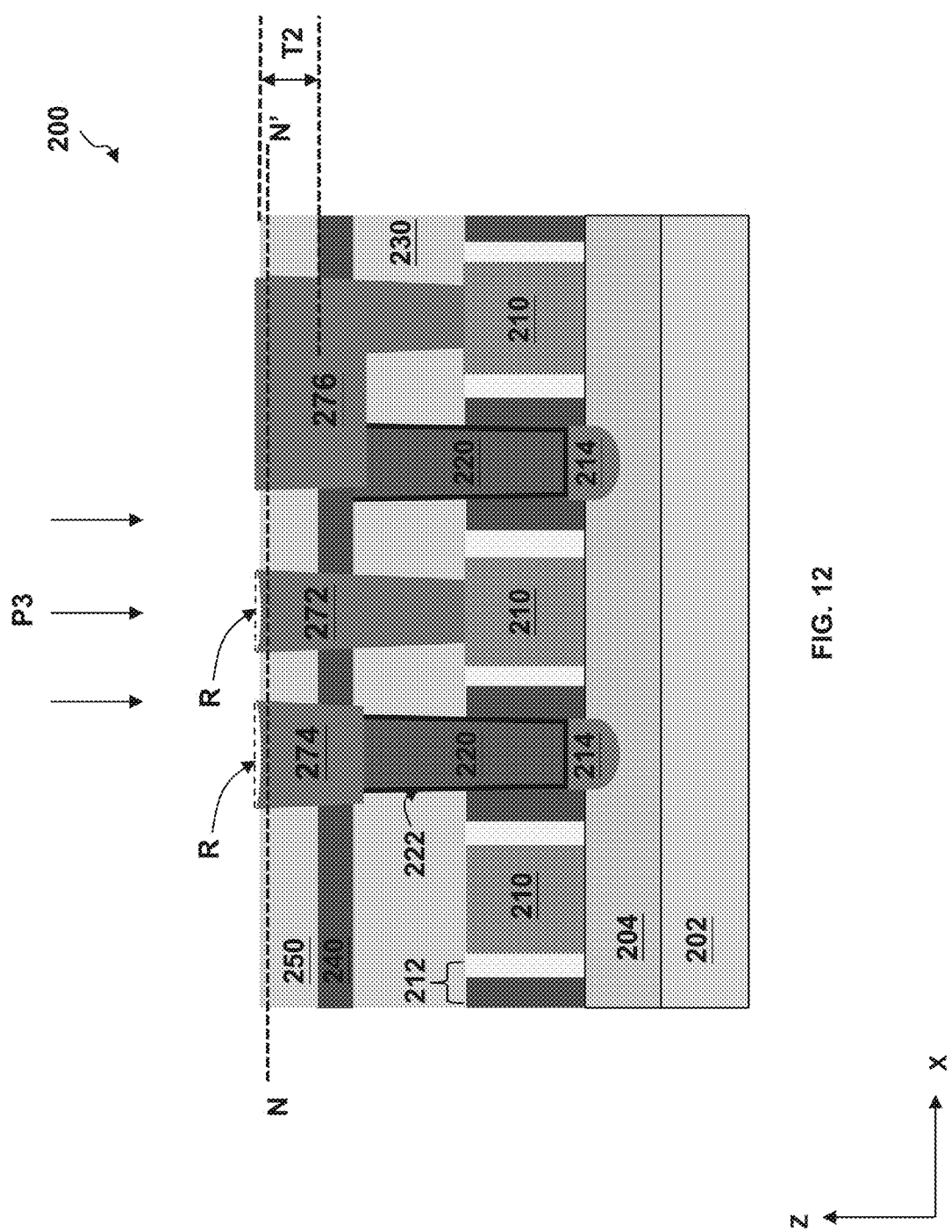

Thereafter, referring to FIG. 12, the method 300 at operation 308 performs a second CMP process P2 to further planarize the top surface of the device 200. In the depicted embodiments, the second CMP process P2 is implemented along dotted line MM' as depicted in FIG. 11 and is configured to remove portions of the ILD layer 250, the via contact 272, the via contact 274, and the BCT 276. The extent of material removal by the CMP process P2 is controlled by monitoring the duration of the polishing process, such that a desired amount of the ILD layer 250, defined by a thickness T2, remains after implementing the CMP process P2. In some embodiments, the CMP process P2 is configured to tune the ILD layer 250 to have a desired profile while removing the ILD layer 250.

In the present embodiments, the polishing selectivity as defined above is about 2:1 to about 5:1 for the CMP process P2. In other words, the CMP process P2 removes the ILD layer 250 at a rate that is higher than that of the via contact 272, the via contact 274, and the BCT 276. In the present embodiments, the composition of the CMP slurry implemented at the CMP process P2 differs substantially from that of the CMP process P1, which preferentially removes the via contact 272, the via contact 274, and the BCT 276 with respect to the ILD layer 250. In some embodiments, the CMP process P2 implements a slurry that includes agents configured to suppress the removal of the via contact 272, the via contact 274, and the BCT 276 with respect to the ILD layer 250. For example, the CMP process P2 may implement a slurry that includes more inhibitor (e.g., an amine) than the CMP process P1 to protect metal(s) in the via contact 272, the via contact 274, and the BCT 276 from oxidation. As a result, the slurry implemented for the CMP process P2 may be more basic (i.e., having a pH value of greater than about 7) than the slurry implemented for the CMP process P1. In other words, the slurry implemented at the CMP process P2 suppresses the oxidation of the via contact 272, the via contact 274, and the BCT 276. In the present embodiments, a ratio of the amount of the oxidizer to the amount of inhibitor included in the slurry implemented for the CMP process P2 is defined as X2, and X2 is less than X1. In some embodiments, a ratio of X1 to X2 is about 3:1 to about 10:1. In some examples, X2 may be about 0.05 to about 0.2. Using the oxidation reaction of W above as an example, the amines adsorbed onto the top surfaces of the via contact 272, the via contact 274, and the BCT 276 suppress the production of $WO_x$, thereby reducing the removal rate of W.

For reasons similar to those discussed above with respect to FIG. 11, the top surfaces of the via contacts 272 and 274 as depicted in FIG. 12 may be slightly recessed when performing the CMP process P2, while the top surface of the BCT 276 may remain substantially more leveled with the top surface of the ILD layer 250 than the via contacts 272 and 274. In the present embodiments, the slight, inadvertent recessing results in a dishing profile R in each of the via contacts 272 and 274. In some embodiments, the top surface of the BCT 276 is also recessed by the CMP process P2; however, the extent of such recessing does not cause any significant dishing profile as it does in the cases for the via contact 272 and 274. If the fabrication process subsequently proceeds to forming horizontal interconnect features (and/or other interconnect features) over the via contact 272 and 274 as depicted in FIG. 12, a void can form where the dishing profile R is present, leading to poor electrical contact, and thus increased contact resistance, between the horizontal interconnect features and the underlying via contacts. As discussed in detail below, the present embodiments are directed to correcting the dishing profiles inadvertently formed in via contacts after performing planarization process(es).

Referring to FIG. 13, the method 300 at operation 310 performs a CMP process P3 to selectively remove portions of the remaining ILD layer 250 with respect to the via contact 272, the via contact 274, and the BCT 276 along dotted line NN' as depicted in FIG. 12, resulting in each of the via contact 272, the via contact 274, and the BCT 276 protruding from the top surface of the ILD layer 250. Similar to the CMP process P2 implemented at operation 308, the CMP process P3 preferentially removes the ILD layer 250 with respect to the via contact 272, the via contact 274, and the BCT 276. However, the polishing selectivity of the CMP process P3 as defined herein is substantially greater than that of the CMP process P2. In some embodiments, for example, the polishing selectivity of the CMP process P3 is from about 13:1 to about 16:1, signifying that the ILD layer 250 is removed at a substantially higher rate than the via contact 272, the via contact 274, and the BCT 276. Stated differently, a thickness T3 of the resulting ILD layer 250 is substantially less than T2 as defined previously with respect to FIG. 12. Accordingly, a difference between the thickness T2 and the thickness T3 may be generally proportional to a difference between the polishing selectivity of the CMP process P2 and the CMP process P3.

In the present embodiments, this polishing selectivity is achieved by further adjusting the relative amounts of oxidizers and inhibitors in the CMP slurry. For example, when compared with the slurry implemented for the CMP process P2, the slurry implemented for the CMP process P3 includes an even greater amount of inhibitors (e.g., amines) configured to suppress dissolution or oxidation of the metal(s) in the via contact 272, the via contact 274, and the BCT 276. As a result, the slurry implemented at the CMP process P3 has a greater pH than that implemented at the CMP process P2. In the present embodiments, a ratio of the amount of oxidizer to the amount of inhibitor included in the slurry implemented for the CMP process P3 is defined as X3, and X3 is less than X2 as previously defined for the CMP process P2. In some embodiments, a ratio of X2 to X3 is about 1:1 to about 4:1. For example, X3 may be about 0.05 to about 2.

In some embodiments, the CMP process P3 is omitted and the slurry composition for the CMP process P2 is adjusted accordingly to achieve the desired polishing results as discussed above. In one such example, a polishing selectivity of the CMP process P2 may be increased to about 5:1 to about 10:1 (from about 2:1 to about 5:1) as a result of an increase in the amount of inhibitor included in the slurry for the CMP process P2. In some examples, the amount of inhibitor may decrease by about three-fold compared to X2 as defined previously.

In the present embodiments, referring to FIG. 13, selective removal of the ILD layer 250 results in the via contact 272, the via contact 274, and the BCT 276 to protrude from the top surface of the ILD layer 250. In other words, the topmost portion of each of the via contact 272, the via contact 274, and the BCT 276 is above the top surface of the ILD layer 250 after performing the CMP process P3 (or the CMP process P2 if the CMP process P3 is omitted).

In the present embodiments, the protruded portions 272P, 274P, and 276P may be defined by a height H1, H2, and H3, respectively, which is measured from the top surface of the ILD layer 250 to a top surface of the via contact 272, the via contact 274, and the BCT 276, respectively. In the depicted embodiments, H1, H2, and H3 are greater than 0. In some embodiments, H1 is similar or substantially the same as H2, and H3 is greater than both H1 and H2. In some examples, a ratio of H3 to H1 (or H2) may be greater than about 1:1 and less than about 3:1. For reasons similar to those discussed above, the larger polishing area of the BCT 276 means less material is removed by the CMP process P3, thereby resulting in H3 being greater than H1 and/or H2. The protruded portions 272P, 274P, and 276P may be further defined by a width L1, L2, and L3, respectively, as shown in FIG. 13. In some examples, a ratio of H1 to L1, a ratio of H2 to L2, and a ratio of H3 to L3 may be less than about 1.5. In some embodiments, though not depicted, the top surfaces of the via contact 272, the via contact 274, and the BCT 276 are substantially planar with the top surface of the ILD layer 250, i.e., H1, H2, and H3 are approximately 0. In other words, the present disclosure provides that the top surface of each of the via contact 272, the via contact 274, and the BCT 276 is at or above the top surface of the ILD layer 250. The present embodiments do not limit specific configurations of how the protruded portions 272P, 274P, and 276P are arranged in the device 200. In some embodiments, for example, all the protruded portions 272P, 274P, and 276P are present in the device 200 i.e., each one of H1, H2, and H3 is greater than 0. In some embodiments, device 200 includes any one or two of these protruded portions, i.e., any one or two of H1, H2, and H3 are approximately 0.

In some embodiments, one or more of the protruded portions 272P, 274P, and 276P is configured to have a step profile with rounded corners, which indicate slightly greater extent of polishing at the corners compared to the center portion. In some embodiments, one or more of the protruded portions 272P, 274P, and 276P is configured to have a profile 277 as depicted in FIG. 13, where the profile 277 may be of a convex (i.e., curved downward) shape. The profile 277 may be further defined by a ratio of H4 to L4 (defined similarly as H1 and L1 above) of less than about 1.5.

Figure 14:
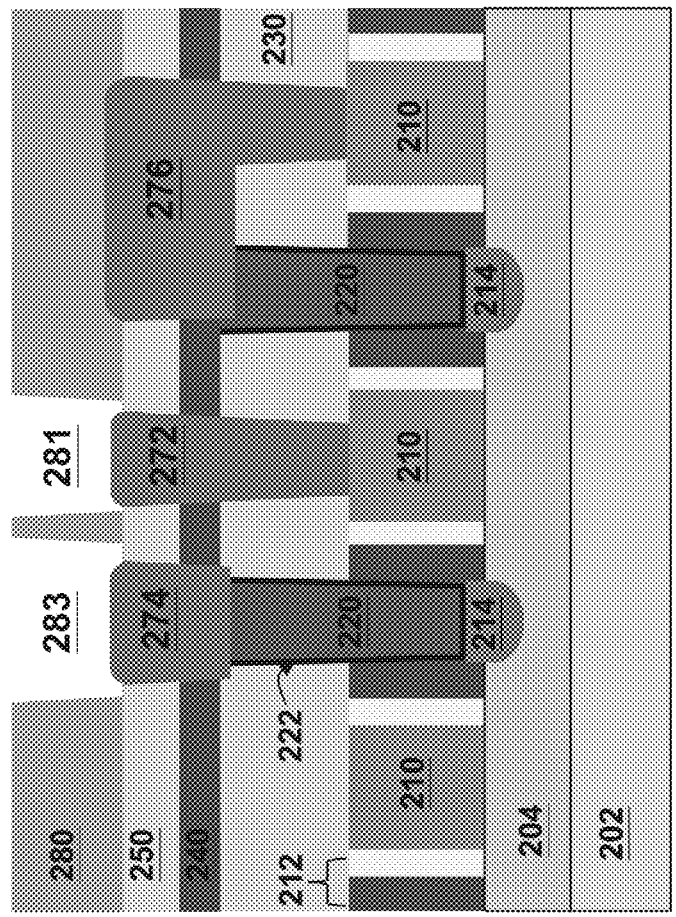
Figure 15:
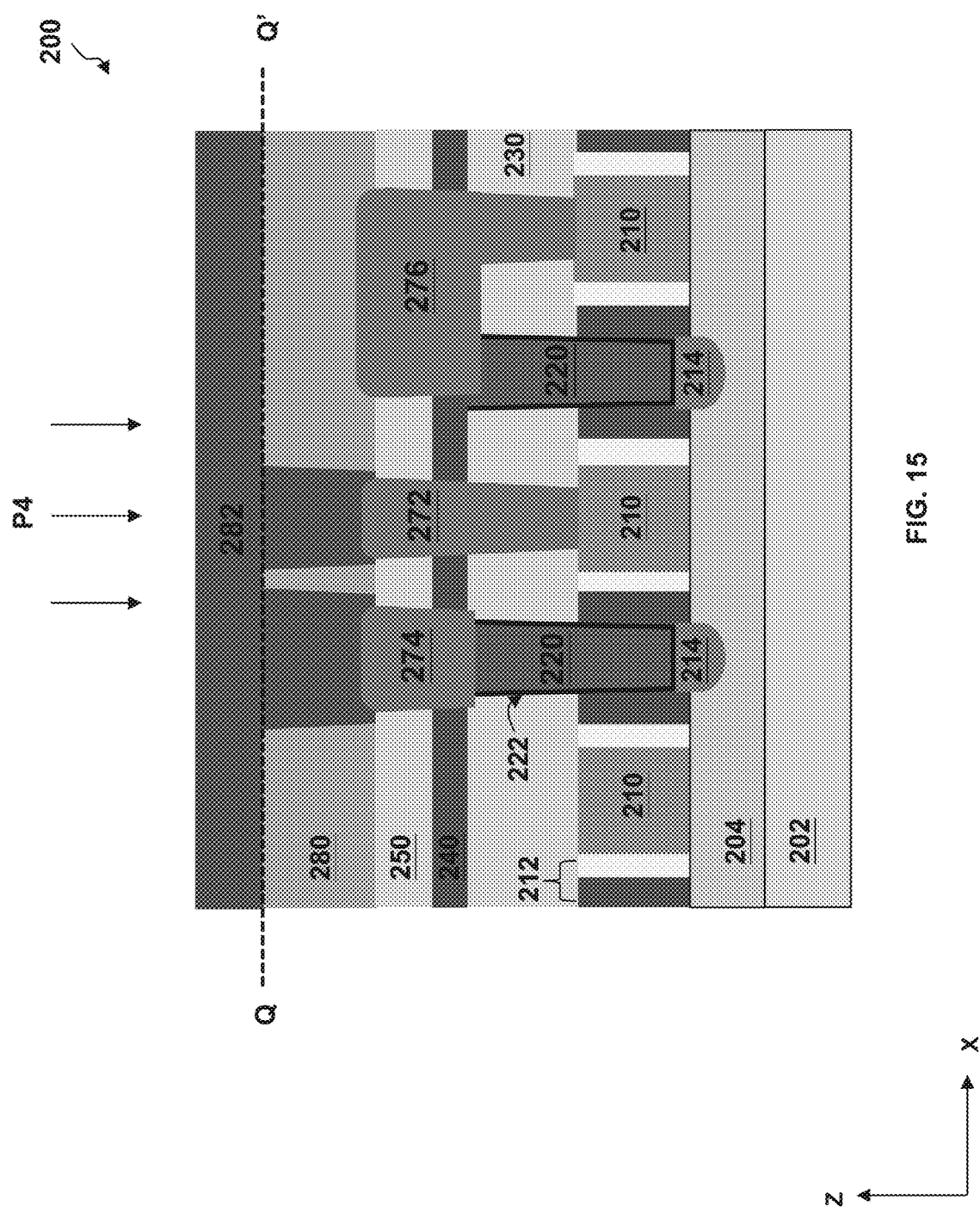
Figure 16:
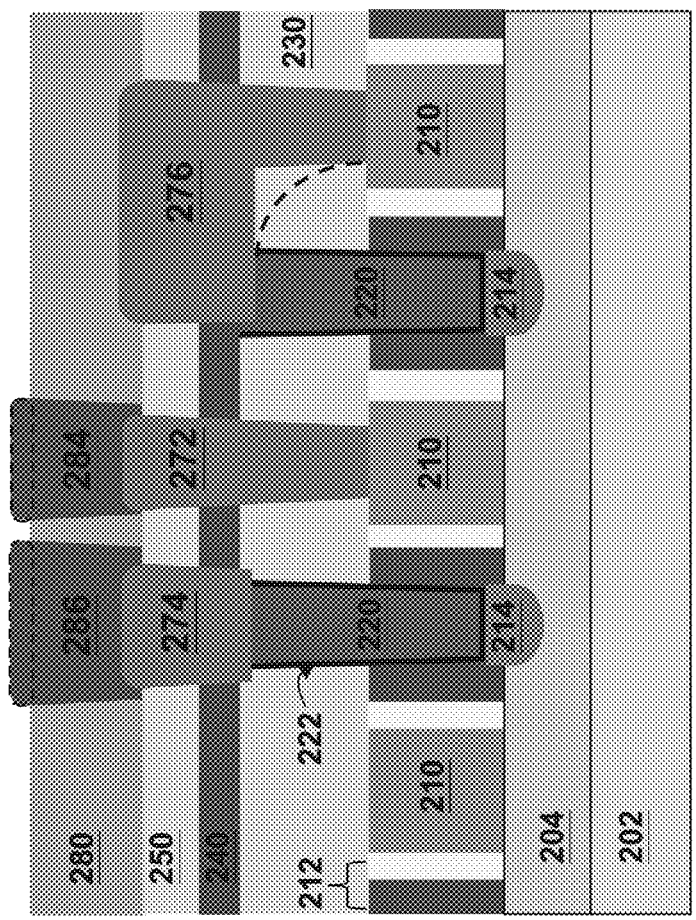

Referring back to FIG. 1A and to FIGS. 14, 15, and 16, after performing the CMP process P3, the method 100 at operation 108 forms horizontal interconnect features 284 and 286 over the via contacts 272 and 274, respectively. In the present embodiments, the horizontal interconnect features 284 and 286 are configured to electrically couple the via contacts 272 and 274, respectively, to additional components of the device 200 and are hereafter referred to as conductive lines 284 and 286. The conductive lines 284 and 286 may be formed by a series of patterning and deposition processes. For example, referring to FIG. 14, forming the conductive lines 284 and 286 includes forming an ILD layer 280 (similar to the ILD layer 230 as discussed above) over the via contacts 272 and 274, forming a patterned masking element (not depicted) over and exposing portions of the ILD layer 280, and etching portions of the ILD layer 280 using the patterned masking element as a mask to expose the via contacts 272 and 274 in openings 281 and 283, respectively. Thereafter, referring to FIG. 15, a conductive layer 282 including Co, W, Ru, Cu, Ta, Ti, Al, Mo, other suitable materials, or combinations thereof may be deposited in the openings 281 and 283 by any suitable method, such as CVD, PVD, ALD, plating, other suitable methods, or combinations thereof. In the present embodiments, the conductive layer 282 includes Cu. In some embodiments, a barrier layer is deposited in the openings 281 and 283 before forming the conductive layer 282 by a suitable deposition process, such as ALD. The barrier layer may include Ti, TiN, Ta, TaN, other suitable materials, or combinations thereof.

Subsequently, referring to FIGS. 15 and 16, the method 100 may implement a planarization process P4 to the device 200, thereby forming the conductive lines 284 and 286. The planarization process P4 may implement the method 300 discussed above, i.e., the planarization process P4 may include one or more CMP processes similar to the CMP processes P1, P2, and/or P3. For example, the planarization process P4 includes performing a CMP process similar to the CMP process P1 configured to remove the portions of the conductive layer 282 (and the barrier layer, if included) formed over the ILD layer 280 along dotted line QQ' as depicted in FIG. 15. Optionally, the planarization process P4 may further perform one or more CMP processes similar to the CMP process P2 and/or the CMP process P3 to remove portions of the conductive layer 282 and the ILD layer 280, such that top portions (marked by dotted lines) of the resulting conductive lines 284 and 286 protrude above a top surface of the ILD layer 280, as depicted in FIG. 16. Of course, compositions of various CMP slurries implemented during the planarization process P4 may be similar to or different from those discussed above with respect to the CMP processes P1-P3, depending upon specific metal(s) selected for the composition of the conductive layer 282. In some embodiments, as discussed above with respect to FIG. 10, a portion of the via contact 274 extends downward to below the top surface of the S/D contact 220. Additionally, in some embodiments, the bottom portion of the conductive layer 270 connecting the S/D contact 220 to the HKMG structure 210 is configured to have a curved surface denoted by the dotted line.

In the present embodiments, the protruded portions 272P and 274P extend into (i.e., are embedded in) and establish more intimate contact with the conductive lines 284 and 286, respectively. As a result, the contact area between the via contacts 272 and 274 and their respective horizontal interconnect features is increased, and the contact resistance therebetween is reduced as a result. Thereafter, the method 100 at operation 110 may perform additional processing steps to the device 200. For example, additional interconnect features (e.g., via contacts and conductive lines) and dielectric layers (e.g., ILD layers and ESLs) may be formed over the device 200 accordingly to various design requirements.

Although not intended to be limiting, one or more embodiments of the present disclosure provide many benefits to a semiconductor device and the formation thereof. For example, embodiments of the present disclosure provide a method of planarizing interconnect features (e.g., vias, butted contacts, etc.) using at least two CMP processes to form protruding interconnect features with respect to their surrounding ILD layer. In various embodiments, the present disclosure provides CMP processes having different slurry compositions and polishing selectivity to achieve the desired polishing results. For example, the present embodiments implement a first CMP process that preferentially removes the conductive material of the interconnect features with respect to the ILD layer, a second CMP process that preferentially removes the ILD layer with respect to the conductive material, and subsequently a third CMP process that preferentially removes the ILD layer in order to form a protruding profile in the resulting interconnect features. In some embodiments, the third CMP process preferentially removes the ILD layer at a greater rate than the second CMP process. In some examples, the second and the third CMP processes may be combined to achieve the desired polishing results. The embodiments presented herein may be readily combined with existing semiconductor fabrication processes according to various design requirements.

In one aspect, the present embodiments provide a method that includes forming a first conductive feature over a semiconductor substrate, forming an ILD layer over the first conductive feature, patterning the ILD layer to form a trench, and forming a conductive layer over the patterned ILD layer to fill the trench. The method further includes polishing the conductive layer to form a via contact configured to interconnect the first conductive feature with a second conductive feature, where polishing the conductive layer exposes a top surface of the ILD layer, polishing the exposed top surface of the ILD layer, such that a top portion of the via contact protrudes from the exposed top surface of the ILD layer, and forming the second conductive feature over the via contact, such that the top portion of the via contact extends into the second conductive feature.

In another aspect, the present embodiments provide a method that includes forming a conductive feature over a semiconductor substrate, forming and patterning a first ILD layer over the conductive feature, depositing a conductive layer over the patterned first ILD layer, performing a first CMP process to the conductive layer, thereby forming a first interconnect feature having a dishing profile at top surface, where the first interconnect feature is configured to electrically couple the conductive feature with a second interconnect feature, and subsequently planarizing the first interconnect feature. In the present embodiments, planarizing the first interconnect feature includes performing a second CMP process to remove a first portion of the first ILD layer and performing a third CMP process to remove a second portion of the first ILD layer disposed below the first portion, where performing the third CMP process removes the dishing profile. The method further includes forming a second ILD layer over the first interconnect feature, where a top portion of the first interconnect feature is embedded in the second ILD layer, and subsequently forming the second interconnect feature in the second ILD layer.

In yet another aspect, the present embodiments provide a semiconductor structure that includes a conductive feature disposed over a semiconductor substrate, a first ILD layer disposed over the conductive feature, a first interconnect feature disposed in the first ILD layer, a second ILD layer disposed over the first ILD layer, and a second interconnect feature disposed in the second ILD layer and coupled to the conductive feature by the first interconnect feature. In the present embodiment, a top portion of the first interconnect feature extends into the second interconnect feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   forming a first conductive feature over a semiconductor substrate;
   forming an interlayer dielectric (ILD) layer over the first conductive feature;
   patterning the ILD layer to form a trench;
   forming a conductive layer over the patterned ILD layer to fill the trench;
   polishing the conductive layer to form a via contact configured to interconnect the first conductive feature with a second conductive feature, wherein polishing the conductive layer exposes a top surface of the ILD layer;
   polishing the exposed top surface of the ILD layer, such that a top portion of the via contact protrudes from the exposed top surface of the ILD layer; and
   forming the second conductive feature over the via contact, such that the top portion of the via contact extends into the second conductive feature.
2. The method of claim 1, wherein polishing the conductive layer includes performing a first chemical-mechanical polishing (CMP) process, and wherein the first CMP process implements a first CMP slurry.
3. The method of claim 2, wherein polishing the exposed top surface of the ILD layer includes performing a second CMP process followed by a third CMP process, wherein the second CMP process implements a second CMP slurry, wherein the third CMP process implements a third CMP slurry, and wherein the first CMP slurry, the second CMP slurry, and the third CMP slurry include different compositions.
4. The method of claim 3, wherein a pH of the first CMP slurry is lower than pH of the second CMP slurry and pH of the third CMP slurry.
5. The method of claim 3, wherein the third CMP process removes the ILD layer at a greater rate than the second CMP process.
6. The method of claim 1, wherein polishing the conductive layer forms a concave profile in the top portion of the via contact, and wherein polishing the exposed top surface of the ILD layer forms a convex profile in the top portion of the via contact.
7. The method of claim 1, wherein forming the first conductive feature includes forming a source/drain contact or forming a metal gate stack.
8. A method, comprising:
   forming a conductive feature over a semiconductor substrate;
   forming a first interlayer dielectric (ILD) layer over the conductive feature;
   patterning the first ILD layer;
   depositing a conductive layer over the patterned first ILD layer;
   performing a first chemical-mechanical polishing (CMP) process to the conductive layer, thereby forming a first interconnect feature having a dishing profile at top surface, wherein the first interconnect feature is configured to electrically couple the conductive feature with a second interconnect feature;
   planarizing the first interconnect feature, comprising:
   performing a second CMP process to remove a first portion of the first ILD layer; and
   performing a third CMP process to remove a second portion of the first ILD layer disposed below the first portion, wherein performing the third CMP process removes the dishing profile;
   forming a second ILD layer over the first interconnect feature, wherein a top portion of the first interconnect feature is embedded in the second ILD layer; and
   forming the second interconnect feature in the second ILD layer.
9. The method of claim 8, wherein depositing the conductive layer includes depositing a tungsten-containing material.
10. The method of claim 9, wherein performing the first CMP process implements a catalyst for oxidizing the tungsten-containing material.
11. The method of claim 8, wherein performing the first CMP process, the second CMP process, and the third CMP process include implementing a first slurry having a first pH, a second slurry having a second pH, and a third slurry having a third pH, respectively, wherein the first pH is less than the second pH, and wherein the second pH is less than the third pH.
12. The method of claim 11, wherein the first slurry is configured to promote oxidation of the conductive layer, and wherein the second slurry and the third slurry are configured to suppress oxidation of the conductive layer.
13. The method of claim 8, wherein the second CMP process removes the first portion of the first ILD layer at a first rate and the third CMP process removes the second portion of the first ILD layer at a second rate, and wherein the first rate is less than the second rate.
14. The method of claim 8, wherein forming the second interconnect feature includes forming the second interconnect feature on the first interconnect feature, such that the top portion of the first interconnect feature protrudes into the second interconnect feature.
15. A semiconductor structure, comprising:
   a conductive feature disposed over a semiconductor substrate;
   a first interlayer dielectric (ILD) layer disposed over the conductive feature;
   a first interconnect feature disposed in the first ILD layer, wherein the first interconnect feature extends to below a top surface of the conductive feature;
   a second ILD layer disposed over the first ILD layer; and
   a second interconnect feature disposed in the second ILD layer, wherein the first interconnect feature couples the conductive feature to the second interconnect feature, wherein a top surface of the second interconnect feature is above a top surface of the second ILD layer, and wherein a top portion of the first interconnect feature extends into the second interconnect feature.
16. The semiconductor structure of claim 15, wherein the conductive feature includes a source/drain contact disposed over the semiconductor substrate.
17. The semiconductor structure of claim 16, wherein the conductive feature is a first conductive feature, the semiconductor structure further comprising:
   a second conductive feature disposed over the semiconductor substrate and under the first interlayer dielectric (ILD) layer;
   a third conductive feature disposed adjacent to the second conductive feature; and
   a butted contact disposed in the first ILD layer and configured to couple the second conductive feature with the third conductive feature, wherein a top portion of the butted contact extends into the second ILD layer.
18. The semiconductor structure of claim 17, wherein the top portion of the first interconnect feature has a first thickness and the top portion of the butted contact has a second thickness, and wherein the second thickness is greater than the first thickness.

19. The semiconductor structure of claim 17, wherein the top portion of the butted contact is more leveled with respect to a top surface of the first ILD layer than the top portion of the first interconnect feature or the second interconnect feature.

20. The semiconductor structure of claim 15, wherein the top portion of the first interconnect feature is defined by a convex profile.

* * * * *